United States Patent
Ofoma et al.

(10) Patent No.: US 8,995,131 B2
(45) Date of Patent: Mar. 31, 2015

(54) HEAT TRANSFER SYSTEM FOR AIRCRAFT STRUCTURES

(75) Inventors: Uchenna Ofoma, San Gabriel, CA (US); Bart Dean Hibbs, Simi Valley, CA (US); Ronald Olch, Van Nuys, CA (US); Justin B. McAllister, Simi Valley, CA (US)

(73) Assignee: AeroVironment, Inc., Monrovia, CA (US)

( * ) Notice: Subject to any disclaimer, the term of this patent is extended or adjusted under 35 U.S.C. 154(b) by 446 days.

(21) Appl. No.: 13/220,338

(22) Filed: Aug. 29, 2011

(65) Prior Publication Data
US 2013/0048242 A1 Feb. 28, 2013

(51) Int. Cl.
*H05K 7/20* (2006.01)
*H01L 23/373* (2006.01)
*H01L 23/36* (2006.01)
*B64D 13/06* (2006.01)

(52) U.S. Cl.
CPC .......... *H05K 7/20509* (2013.01); *H01L 23/373* (2013.01); *H05K 7/20545* (2013.01); *H01L 23/36* (2013.01); *B64D 2013/0614* (2013.01); *H01L 2924/0002* (2013.01)
USPC .......... 361/707; 165/41; 165/185; 244/129.1; 361/704; 428/71; 428/137; 428/178; 428/182

(58) Field of Classification Search
USPC .............. 165/170, 185, 41; 428/71, 178, 182, 428/137; 244/119, 123.1, 123.5, 129.1, 244/133, 117 A; 52/793.1; 361/704, 707
See application file for complete search history.

(56) References Cited

U.S. PATENT DOCUMENTS

| | | | | |
|---|---|---|---|---|
| 1,427,941 A | * | 9/1922 | Blenio | 442/71 |
| 2,868,514 A | * | 1/1959 | Hodson et al. | 165/170 |
| 3,020,986 A | * | 2/1962 | Kirk et al. | 52/793.1 |
| 3,067,594 A | * | 12/1962 | Bland et al. | 62/4 |
| 3,126,718 A | * | 3/1964 | Claude | 62/219 |
| 3,538,719 A | * | 11/1970 | Henri | 62/235 |
| 3,597,891 A | * | 8/1971 | Martin | 52/145 |
| 3,867,244 A | * | 2/1975 | Adams | 428/182 |
| 4,139,670 A | * | 2/1979 | Fehlmann | 428/167 |
| 4,141,338 A | * | 2/1979 | Lof | 126/674 |
| 4,306,616 A | * | 12/1981 | Woods et al. | 165/136 |
| 4,478,277 A | * | 10/1984 | Friedman et al. | 165/185 |

(Continued)

FOREIGN PATENT DOCUMENTS

| | | |
|---|---|---|
| DE | 19630002 A1 | 2/1997 |
| EP | 0297793 A2 | 1/1989 |
| WO | 01/49092 A1 | 7/2001 |

OTHER PUBLICATIONS

PCT/US2012/051496.

*Primary Examiner* — Joseph W Sanderson
(74) *Attorney, Agent, or Firm* — Brinks Gilson & Lione (57) ABSTRACT

A heat transfer system is provided by the present disclosure that includes, in one form, a structural member having an upper skin, a lower skin, and a foam core disposed between the upper skin and the lower skin. At least one heat conducting array extends through the foam core and between the upper skin and the lower skin, the heat conducting array defining at least one upper cap, at least one lower cap, and a wall portion extending between the upper cap and the lower cap, the upper cap being disposed proximate a heat source. A heat conducting spreader is disposed between the lower cap of the heat conducting array and the lower skin of the structural member.

23 Claims, 12 Drawing Sheets

Atmosphere

(56) References Cited

U.S. PATENT DOCUMENTS

| | | | |
|---|---|---|---|
| 4,726,707 A * | 2/1988 | Newton | 404/25 |
| 4,838,347 A * | 6/1989 | Dentini et al. | 165/185 |
| 4,925,134 A * | 5/1990 | Keller et al. | 244/171.7 |
| 5,053,265 A * | 10/1991 | Alexander | 428/182 |
| 5,810,284 A * | 9/1998 | Hibbs et al. | 244/13 |
| 5,821,612 A * | 10/1998 | Kitagawa | 257/675 |
| 6,746,755 B2 * | 6/2004 | Morrison et al. | 428/166 |
| 7,093,649 B2 * | 8/2006 | Dawson | 165/166 |
| 7,320,361 B2 * | 1/2008 | Arai et al. | 165/166 |
| 8,490,365 B2 * | 7/2013 | Mueller et al. | 52/783.1 |
| 2002/0172010 A1 * | 11/2002 | Sarno et al. | 361/719 |
| 2003/0059581 A1 * | 3/2003 | Whalen | 428/182 |
| 2003/0136551 A1 * | 7/2003 | Bakke | 165/104.26 |
| 2005/0263273 A1 * | 12/2005 | Crumly | 165/170 |
| 2006/0234056 A1 | 10/2006 | Huang et al. | |
| 2006/0269720 A1 * | 11/2006 | Guanci | 428/72 |
| 2008/0196869 A1 | 8/2008 | Behrens et al. | |
| 2009/0288814 A1 * | 11/2009 | Stoia et al. | 165/185 |
| 2010/0086746 A1 * | 4/2010 | Kersnick et al. | 428/182 |
| 2010/0263846 A1 * | 10/2010 | Dietz et al. | 165/170 |
| 2010/0319892 A1 * | 12/2010 | Majette | 165/170 |
| 2012/0038849 A1 * | 2/2012 | Dunn et al. | 349/61 |
| 2012/0125582 A1 * | 5/2012 | Hansen | 165/170 |
| 2013/0047435 A1 * | 2/2013 | Ofoma et al. | 29/890.03 |
| 2013/0048262 A1 * | 2/2013 | Ofoma et al. | 165/185 |

* cited by examiner

HEAT TRANSFER SYSTEM FOR AIRCRAFT STRUCTURES

FIELD

The present disclosure relates to avionics or equipment bays for aircraft, and in particular, systems for managing heat to improve cooling of electronics within the bays.

BACKGROUND

The statements in this section merely provide background information related to the present disclosure and may not constitute prior art.

Most aircraft, or air vehicles, typically include a number of bays that house a variety of equipment, such as avionics, batteries, diagnostic equipment, and servicing ports, among others. These bays extend into the interior of the aircraft to define a cavity, and are covered by removable doors or access panels so that the aircraft can maintain a smooth outer moldline surface for aerodynamic performance.

During operation, certain components located within these equipment bays can reach high temperatures, which can cause premature failure, and thus a means to provide cooling to these components is often provided. Typical methods may include integrated fans or cooling ducts, in addition to vents or louvers that allow airflow to enter the equipment bays during flight. Some equipment bays, however, are required to be sealed from moisture intrusion during operations, which limits certain cooling options, such as the vents or louvers. Accordingly, sealed equipment bays that include heat generating components, such as electronic components on printed circuit boards, or batteries, present a challenge in providing the requisite cooling to prevent premature equipment failure.

SUMMARY

In one form of the present disclosure, a heat transfer system is provided that comprises a structural member including an upper skin, a lower skin, and a foam core disposed between the upper skin and the lower skin. At least one heat conducting array extends through the foam core and between the upper skin and the lower skin, the heat conducting array defining at least one upper cap, at least one lower cap, and a wall portion extending between the upper cap and the lower cap, the upper cap being disposed proximate a heat source. A heat conducting spreader is disposed between the lower cap of the heat conducting array and the lower skin of the structural member.

In another form, a heat transfer system is provided that comprises a structural member having an upper skin, a lower skin, and a foam core disposed between the upper skin and the lower skin. A heat conducting array extends through the foam core and between the upper skin and the lower skin, the heat conducting array defining a plurality of upper caps, a plurality of lower caps, and wall portions extending between the upper caps and the lower caps, the upper caps being disposed proximate heat sources. A heat conducting spreader is disposed between the lower caps of the heat conducting array and the lower skin of the structural member, wherein the heat conducting array and the heat conducting spreader define a pyrolytic graphite sheet (PGS) material.

In still another form, a heat transfer system is provided that comprises at least one heat conducting array extending through a structure, the heat conducting array defining at least one upper cap, at least one lower cap, and a wall portion extending between the upper cap and the lower cap, the upper cap being disposed proximate a heat source. A heat conducting spreader is disposed along the lower cap of the heat conducting array.

Further yet, a heat transfer system is provided that comprises a structural member having an upper skin, a lower skin, and a core disposed between the upper skin and the lower skin. A heat conducting array extends through the core and between the upper skin and the lower skin, the heat conducting array defining at least one upper cap, at least one lower cap, and at least one wall portion extending between the upper cap and the lower cap, the upper cap being disposed proximate heat sources.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Figure 1:
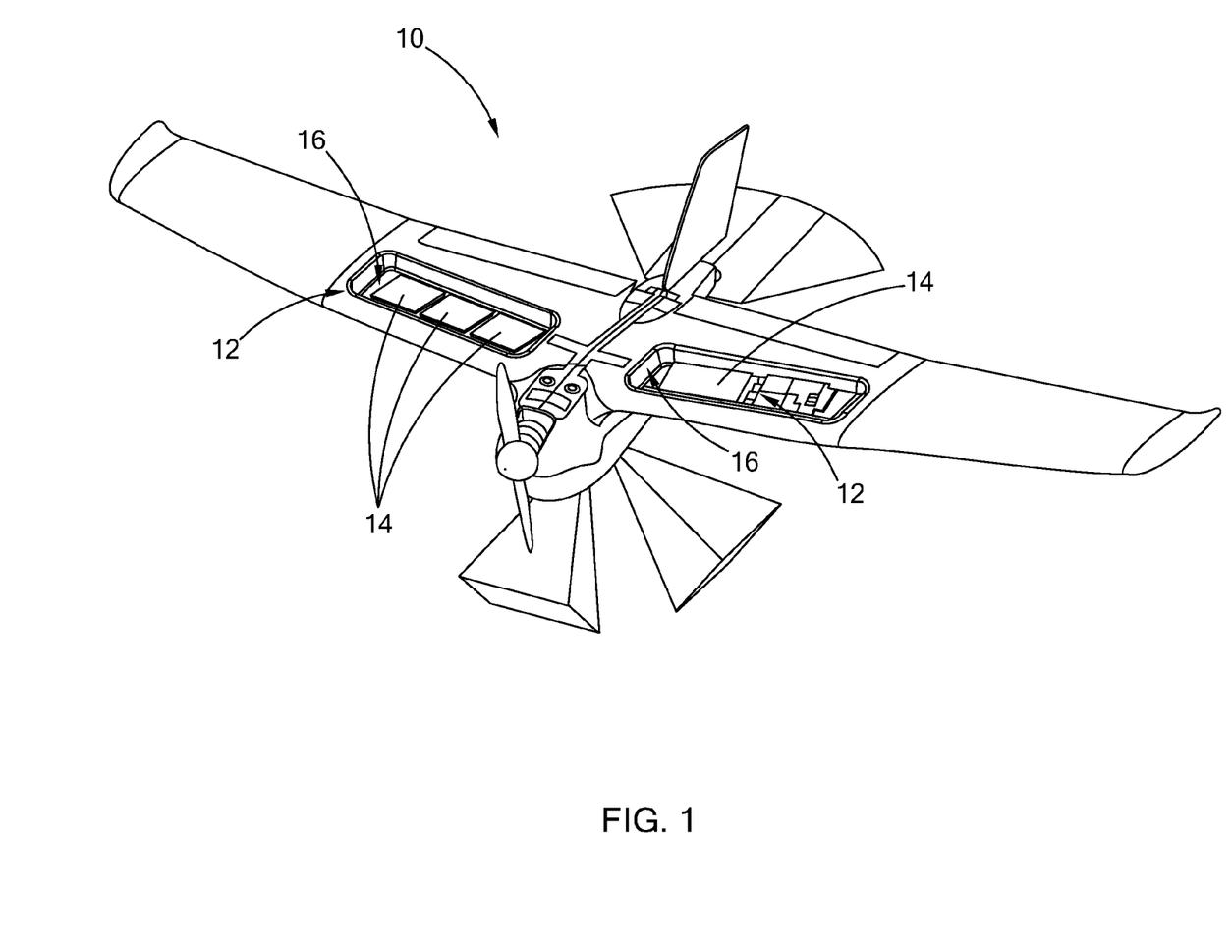
FIG. 1 is a perspective view of an exemplary air vehicle illustrating various equipment bays in which the principles of the present disclosure are applied.
Figure 2:
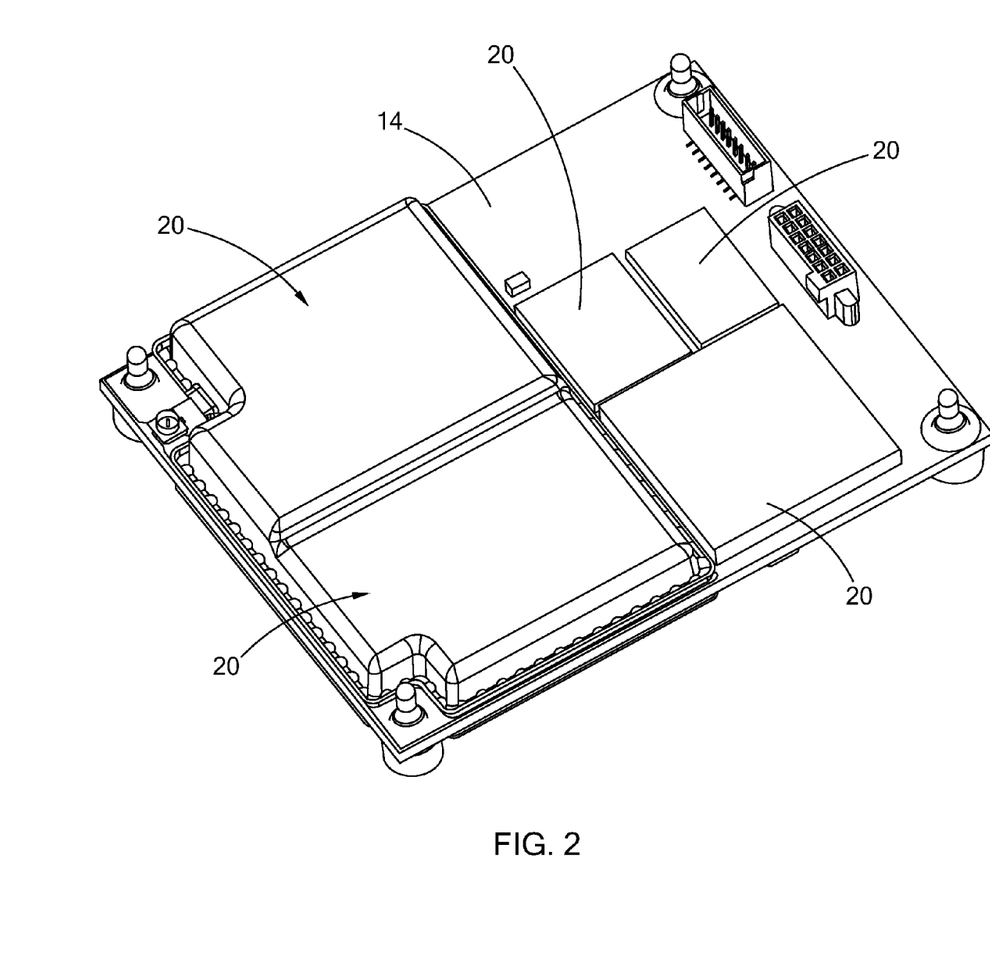
FIG. 2 is a top perspective view of one form of a system for managing heat transfer constructed in accordance with the principles of the present disclosure.

Referring to FIG. 1, an air vehicle is illustrated and generally indicated by reference numeral 10. The air vehicle 10 includes a number of equipment bays 12 that house a variety of equipment such as avionics or batteries, and in this particular illustration, a plurality of avionics boards 14 having electronic components that generate heat during operation. Additionally, some or all of the equipment bays 12 may be sealed in order to prevent moisture intrusion during operation, which is described in greater detail below.

The equipment bays 12 are covered by access panels, or hatches, which are not shown for purposes of clarity. The access panels cover the cavities 16 defined by the equipment bays 12 and generally conform to the outer moldline shape of the air vehicle 10, which in this illustrative example are upper wing moldlines. It should be understood that the air vehicle 10 and its configuration of equipment bays 12 is merely exemplary, and thus any number and/or size of equipment bays 12 may be employed in a variety of different types of air vehicles while remaining within the scope of the present disclosure.

Referring now to FIGS. 2 through 5, an exemplary avionics board 14 is illustrated and has at least one heat-generating component 20 disposed thereon, such as a radio frequency power amplifier. In one form, the avionics board 14 and heat-generating component(s) 20 are part of a system 22 for managing heat transfer according to the principles of the present disclosure that is better illustrated in FIG. 5. As shown, the system 22 includes the avionics board 14 and heat-generating components 20 within the cavity 16, which defines an inner wall portion 24. A plurality of heat conducting members 30 are disposed adjacent one another as shown (and also in FIGS. 3 and 4), which are positioned between the heat generating components 20 and the inner wall portion 24 of the cavity 16. The plurality of heat conducting members 30 generally comprise a core 32 and an outer shell 34 wrapped around at least a portion of the core 32. The outer shell 34 comprises a material having a relatively high thermal conductivity, and in one form is at least one sheet of pyrolytic graphite sheet (PGS) material. The cores 32 are thermally conductive, and in one form are a thermally conductive foam. Furthermore, the cores 32 are resilient in one form of the present disclosure, such that the heat conducting members 30 are more capable of withstanding impact loads. As used herein, the term "resilient" should be construed to mean having properties that allow the cores 32 to elastically or plastically deform under load. Additional details of the heat conducting members 30 and variants thereof are set forth in greater detail below.

Figure 3:
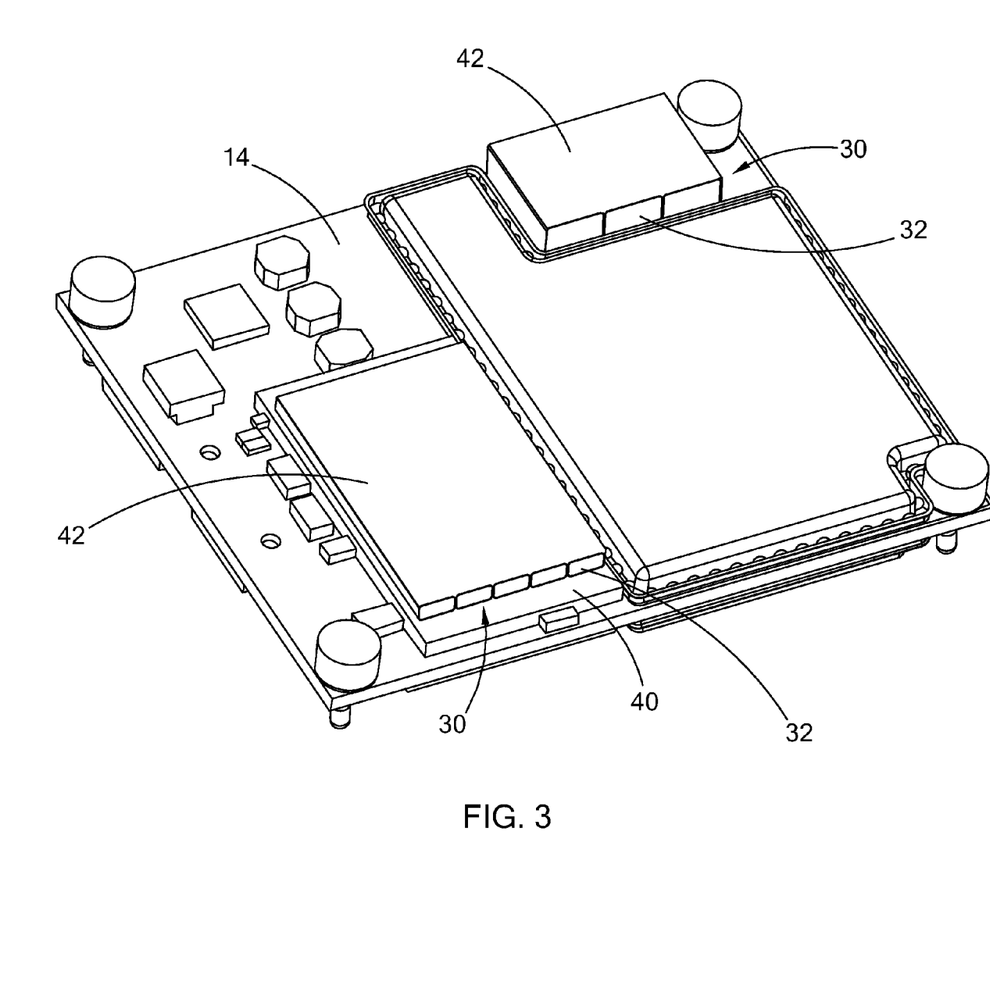
FIG. 3 is a bottom perspective view of the system for managing heat transfer in accordance with the principles of the present disclosure.
Figure 4:
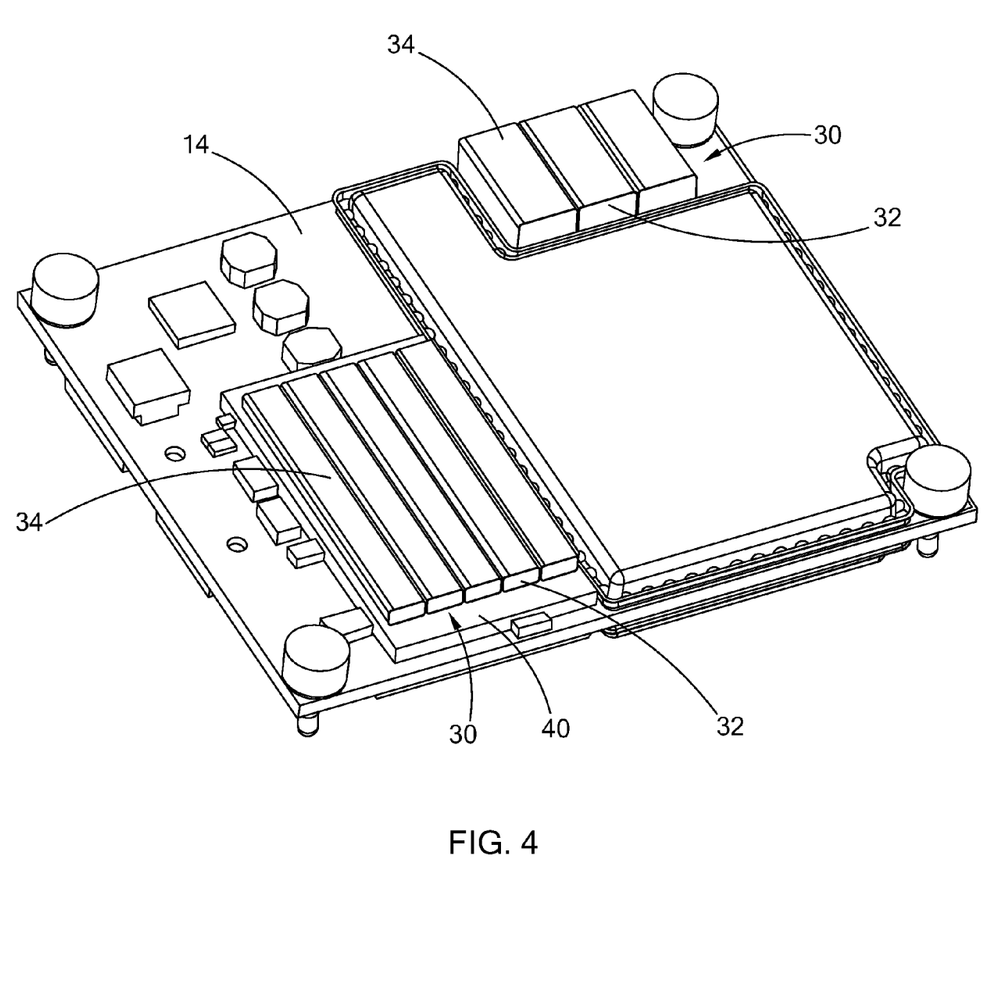
FIG. 4 is another bottom perspective view, with certain components removed for purposes of clarity, of the system for managing heat transfer in accordance with the principles of the present disclosure.
Figure 5:
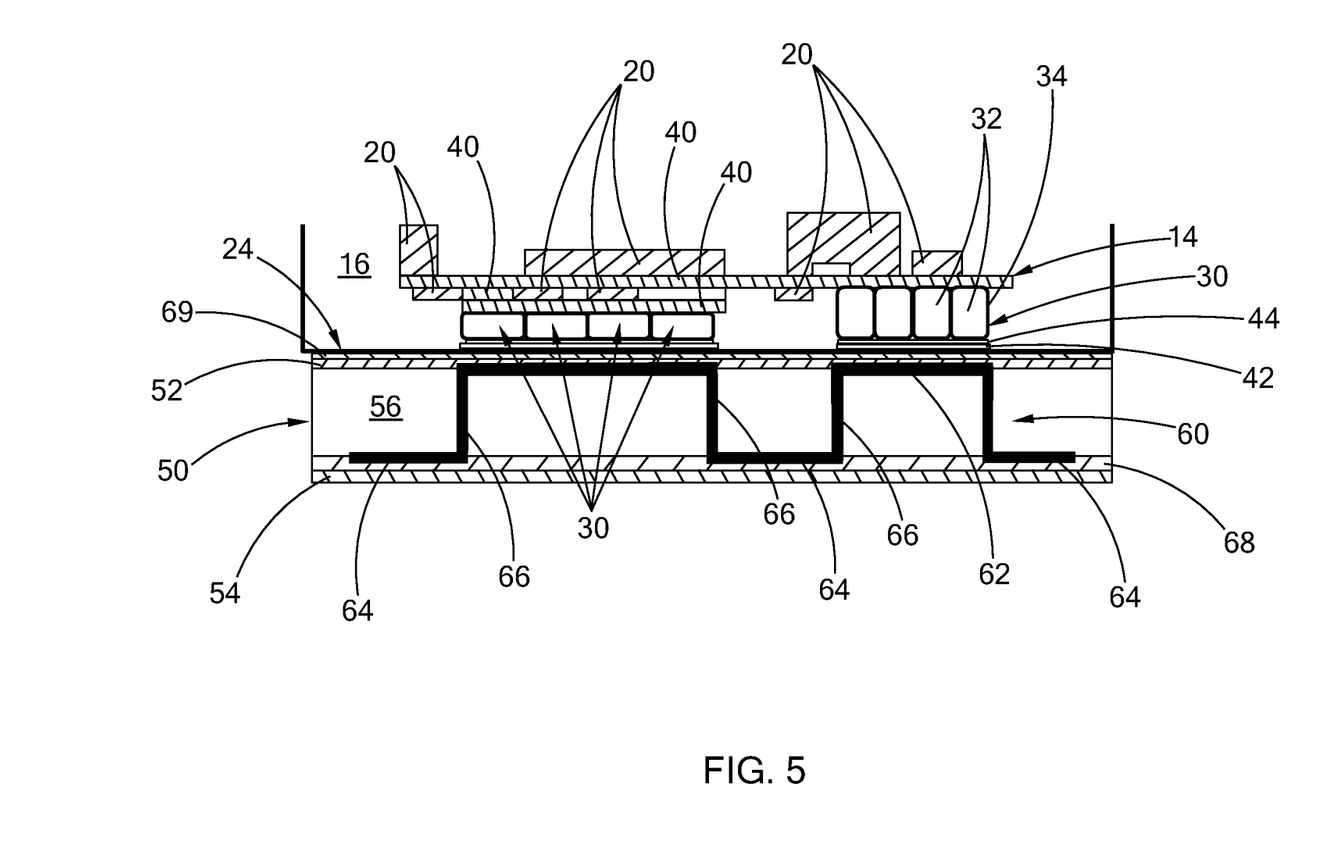
FIG. 5 is an offset cross-sectional view, taken along line 5-5 of FIG. 3, illustrating various components of the system for managing heat transfer in accordance with the principles of the present disclosure.

As further shown in FIG. 5, the system 22 also comprises at least one thermally conductive element 40 disposed between the heat conducting members 30 and the heat generating components 20. In one form, the thermally conductive elements 40 are thermal gap filler pads that have a thermal conductivity of about 5W/mK. The system 22 also includes a pressure-sensitive adhesive (PSA) layer 42 in contact with the inner wall portion 24 to secure the heat conducting members 30 to the cavity 16. (The PSA layer 42 is also shown in FIG. 3). Alternately, a layer of stiffening material 44 may be disposed over the heat conducting members 30 and next to the PSA layer 42 in order to provide additional stiffness to the plurality of heat conducting members 30. In one form, this stiffening material 44 is a copper material, however, it should be understood that other materials that exhibit both thermal conductivity and an appropriate stiffness may also be employed while remaining within the scope of the present disclosure.

The system 22 also includes a structural member 50 disposed proximate the inner wall portion 24 of the cavity 16, which in this form comprises an upper skin 52, a lower skin 54, and a foam core 56 disposed between the upper skin 52 and the lower skin 54. As shown, at least one heat conducting array 60 extends through the foam core 56 and between the upper skin 52 and the lower skin 54. The heat conducting array 60 is also, in one form, a pyrolytic graphite sheet (PGS) material. The heat conducting array 60, in this form, includes at least one upper cap 62, at least one lower cap 64, and a wall portion 66 extending between the upper cap 62 and the lower cap 64. The caps 62 and 64 may also be understood as flanges or legs that extend away from or between the wall portions 66 as illustrated herein. As shown, the upper caps 62 are disposed proximate a heat source, which in this illustration is the heat-generating components 20 and the elements therebetween. Further details of the heat conducting array 60, and variants thereof, are set forth in greater detail below.

As further shown, an optional heat conducting spreader 68 is disposed between the lower caps 64 of the heat conducting array 60 and the lower skin 54 of the structural member 50, in one form of the present disclosure. Similar to forms of the heat conducting member 30 and the heat conducting array 60, the heat conducting spreader 68 is also a pyrolytic graphite sheet (PGS) material in one form of the present disclosure.

In an alternate form, a moisture-proof layer 69 is disposed over the upper skin 52 in an application where the cavity 16 is to be sealed from moisture intrusion. In this form, the moisture-proof layer 69 is an ethylene-co-methacrylic acid (EMAA) material, although it should be understood that other moisture-proof materials may be employed while remaining within the scope of the present disclosure.

Figure 6:
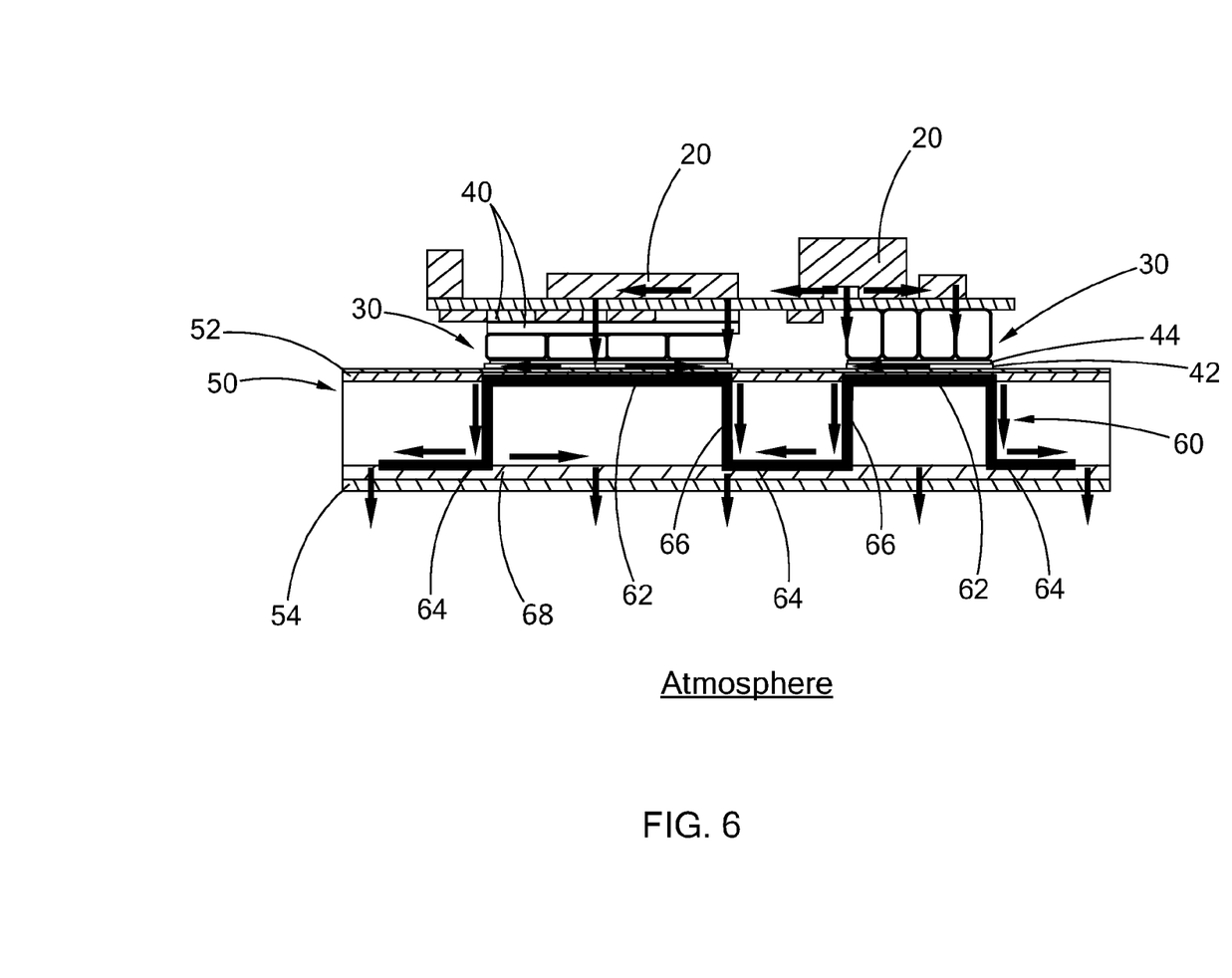
FIG. 6 is the offset cross-sectional view of FIG. 5 illustrating heat flow through the various components, including the heat conducting members, according to the principles of the present disclosure.

Referring now to FIG. 6, the system 22 and its heat transfer characteristics are illustrated and described in greater detail. As indicated by the arrows, in operation, heat that is generated from the components 20 is transferred to the heat conducting members 30 and the thermally conductive elements 40. The heat is then transferred through the PSA layer 42 (and also the stiffening material 44 if present), to the upper skin 52 of the structural member 50. From there, the heat transfers through the upper caps 62 of the heat conducting array 60, then down through the wall portions 66, to the lower caps 64, to the heat conducting spreader 68, and then out to the atmosphere through the lower skin 54. Accordingly, the system 22 provides efficient and effective heat transfer paths in order to dissipate the heat generated by components 20. In preliminary testing, the temperature difference between the heat generating components 20 and the lower skin 54 was reduced by about fourteen percent (14%). In other words, about fourteen percent (14%) of the heat generated by the components 20 did not reach the lower skin 54.

Figure 7:
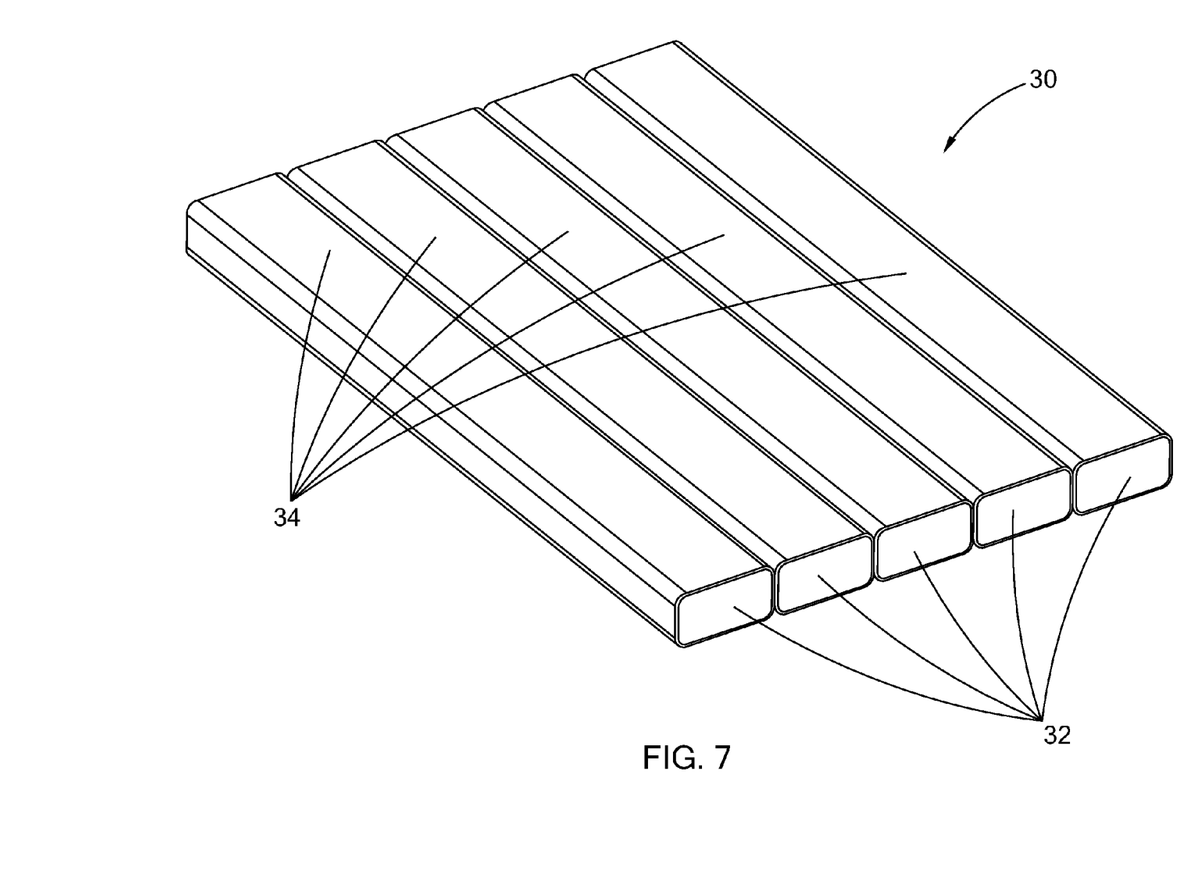
FIG. 7 is a perspective view of a plurality of heat conducting members constructed in accordance with the principles of the present disclosure.

Further details of the heat conducting members 30 are now described with reference to FIGS. 7 and 8. As previously set forth, the heat conducting members 30 include a core 32 and an outer shell 34 wrapped around at least a portion of the core 32. The outer shells 34 of the heat conducting members 30 are in physical contact with each other as shown in FIG. 7 in order to provide improved heat transfer characteristics. In this form, the heat conducting members 30 have a generally rectangular configuration as illustrated. It should be understood that other geometric configurations for the heat conducting members 30, one of which is set forth in greater detail below, are to be construed as falling within the scope of the present disclosure.

Figure 8:
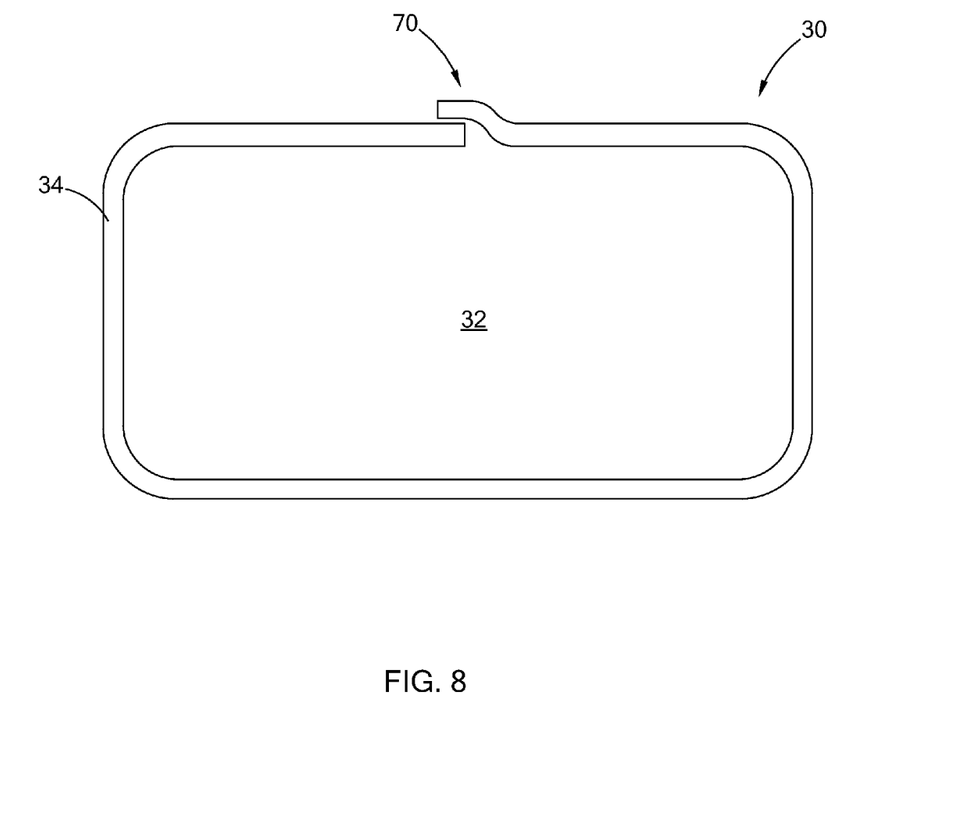
FIG. 8 is an end view of a heat conducting member constructed in accordance with the principles of the present disclosure.

As shown more clearly in FIG. 8, the outer shells 34 of the heat conducting members 30 are wrapped completely around the cores 32. In one form, the outer shells 34 extend around the cores 32 to define an overlap region 70. Accordingly, one end of the outer shell 34 extends over, or overlaps, the other end of the outer shell 34 in order to completely encase the core 32. It should be understood that the outer shells 34 can be configured to be wrapped completely around the cores 32 in other joint configurations, such as a butt or step-lap joint, while remaining within the scope of the present disclosure. Additionally, in some configurations, it is contemplated that the outer shells 34 may be discontinuous or not wrap completely around the cores 32 while remaining within the scope of the present disclosure.

Figure 9:
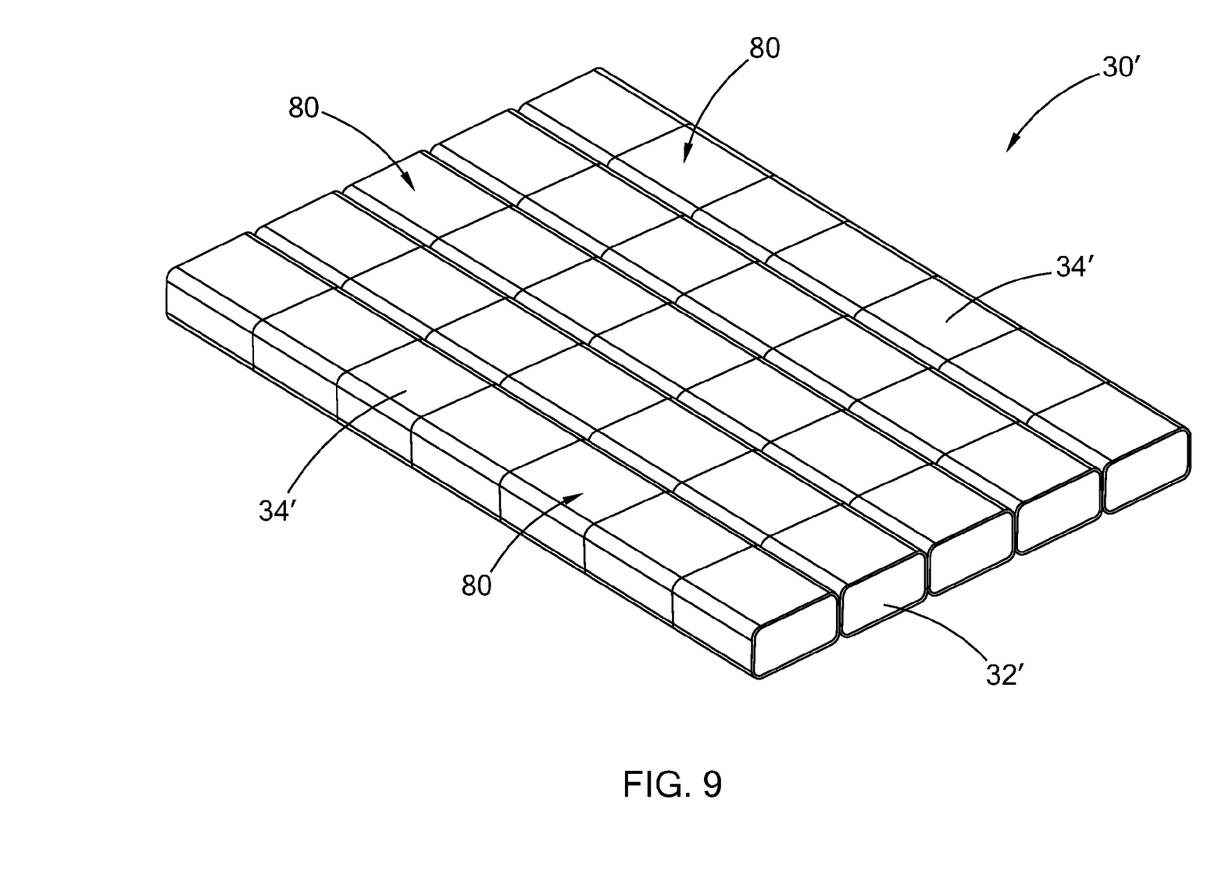
FIG. 9 is a perspective view of an alternate form of the heat conducting members constructed in accordance with the principles of the present disclosure.

Referring now to FIG. 9, another configuration of the heat conducting members is illustrated and generally indicated by reference numeral 30'. In this configuration, the heat conducting members 30' define a grid configuration of individual elements 80, that in one form are in physical contact with one another and that have outer shells 34' that completely encase the cores 32'. It should be understood, however, that other grid configurations having varying geometries for the individual elements 80, and different outer shell configurations as set forth above, shall be construed as falling within the scope of the present disclosure.

Figure 10:
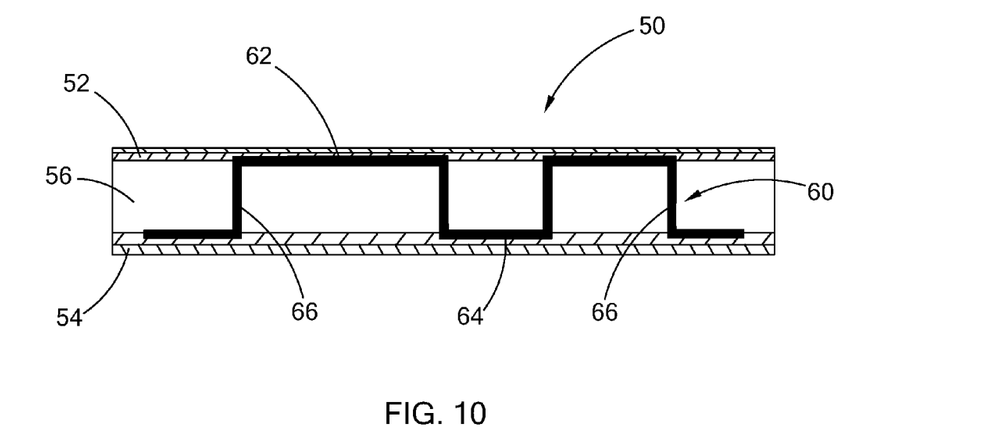
FIG. 10 is an end view of a structural member and heat conducting array constructed in accordance with the principles of the present disclosure.

Referring now to FIG. 10, the structural member 50 and heat conducting array 60 are described in greater detail. As previously set forth, the heat conducting array 60 extends through the foam core 56 and between the upper skin 52 and the lower skin 54 of the structural member. The heat conducting array 60 in one form is a continuous piece, however, it should be understood that the heat conducting array 60 may be discontinuous and/or formed from separate pieces while remaining within the scope of the present disclosure.

The upper skin 52 and lower skin 54 in one form are a para-aramid synthetic fiber material, such as a KEVLAR® brand material, although it should be understood that other types of fiber-reinforced composites such as carbon-fiber composites or glass-fiber composites may also be employed, in addition to various types of metallic structures. In one form, the foam core 56 comprises a low density, high strength polystyrene foam material, such as Spyderfoam. Additionally, the structural member 50 in this form is an aircraft skin, however, it should be understood that this application is merely exemplary and that other forms of structure such as internal spars or ribs, or structures of other vehicles, buildings, or other devices may be employed while remaining within the scope of the present disclosure.

Figure 11:
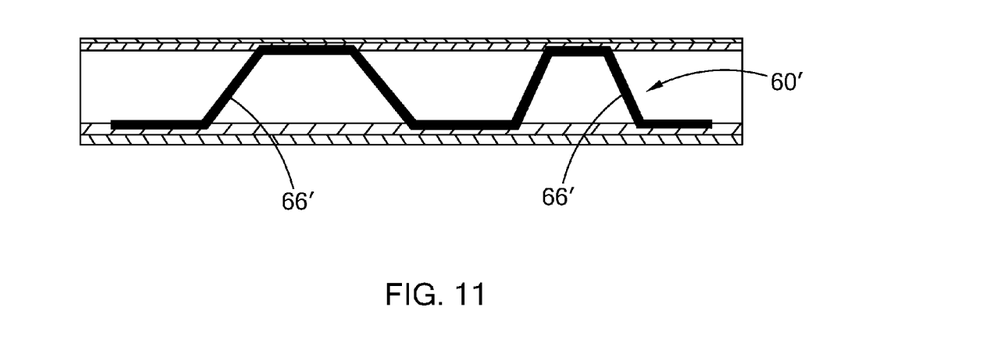
FIG. 11 is an end view of another form of a heat conducting array constructed in accordance with the principles of the present disclosure.

As shown, the wall portions 66 of the heat conducting array 60 extend vertically between the upper caps 62 and the lower caps 64 in one form of the present disclosure. It should be understood, however, that the wall portions 66' may extend at an angle as shown in FIG. 11, creating what is commonly referred to as a "hat" configuration for the heat conducting array 60'. Other variations, including but not limited to "J," "L," or "T" configurations may also be employed according to the heat conducting and structural load requirements of a particular application. Accordingly, it should be understood that a variety of forms of heat conducting arrays 60 may be employed while remaining within the scope of the present disclosure.

Figure 12:
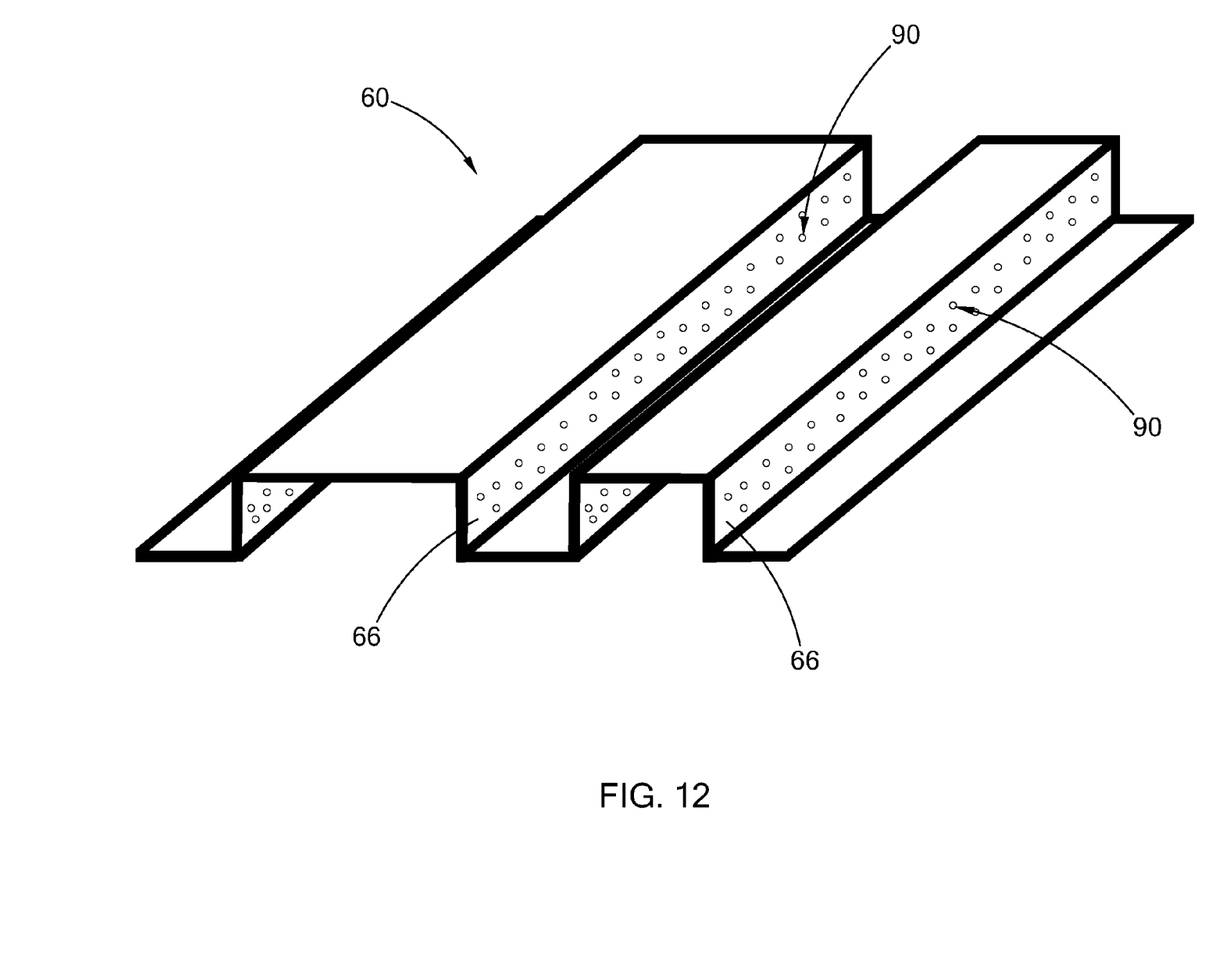
FIG. 12 is a perspective view of a heat conducting array that extends through the structural member and constructed in accordance with the principles of the present disclosure.

Advantageously, as shown in FIG. 12, the wall portions 66 define a plurality of apertures 90, which create openings that allow material of the foam core 56 to migrate through during manufacturing. These apertures 90 provide for improved structural integrity by enhancing the bond between the wall portions 66 and the foam core 56. The manufacture of the structural member 50, and more specifically the heat conducting array 60 and apertures 90, is now described in greater detail.

Figure 13:
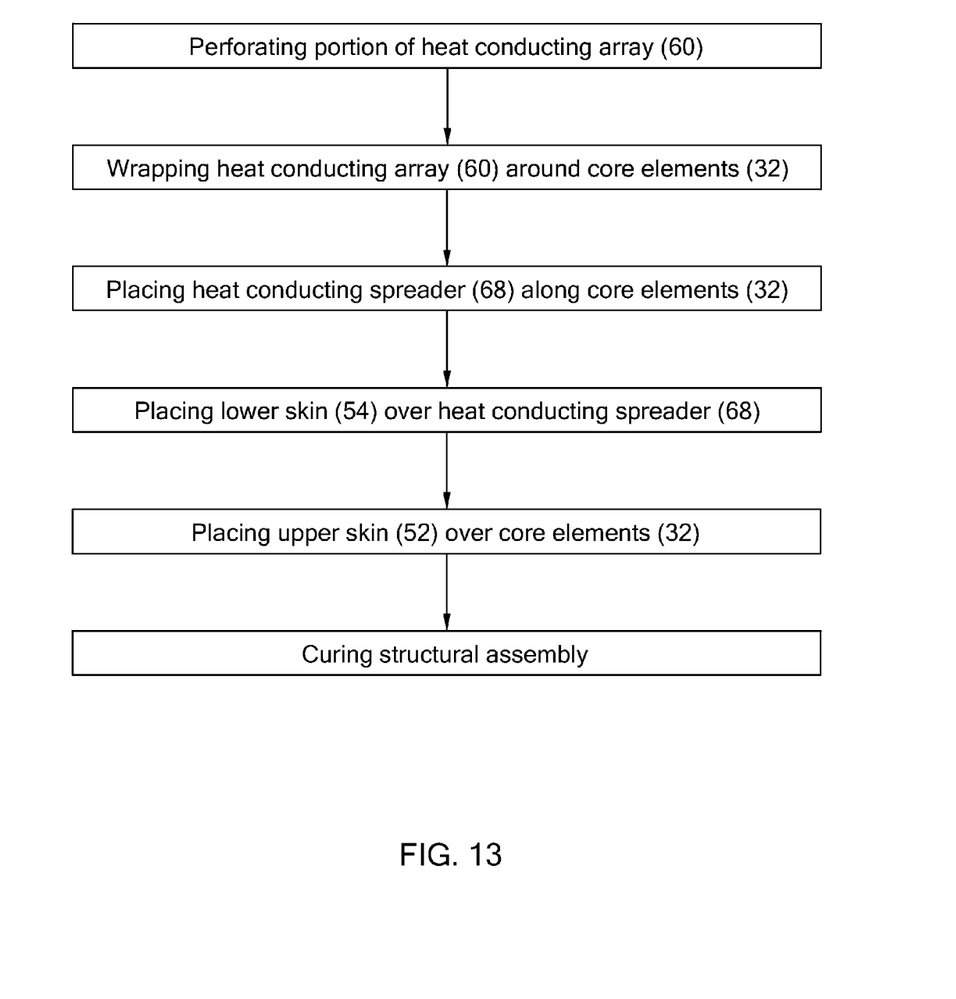
FIG. 13 is a flow diagram illustrating a manufacturing process in accordance with the principles of the present disclosure.

Referring to FIG. 13, the heat conducting array 60 is prepared by perforating at least a portion of the heat conducting array 60, such as the wall portions 66. The heat conducting array 60 is then wrapped around the core elements 32, and the heat conducting spreader 68 is placed along one surface area of the core elements 32. The lower skin 54 is placed over the heat conducting spreader 68, and the upper skin 52 is placed over an opposite surface area of the core elements 32 to create a structural assembly. The structural assembly is then cured, either through a room temperature and standard atmospheric pressure cure or a vacuum autoclave cure, by way of example, wherein a material of the core elements 32 flows through the perforated portions 90 of the heat conducting array 60 during the curing step. As set forth above, this results in an interface between the heat conducting array 60 and the core elements 32 with improved structural integrity.

It should be understood that the order of these manufacturing steps are merely exemplary and that other orders of the steps may be employed, such as placing the upper skin 52 over the heat conducting spreader 68 and the core elements 32 before the lower skin 54, while remaining within the scope of the present disclosure. Additionally, it should be understood that the heat conducting spreader 68 is optional and thus the structural assembly can be formed without this member while remaining within the scope of the present disclosure. Furthermore, the structural assembly may be formed in a press, either heated or non-heated, while remaining within the scope of the present disclosure.

It should be noted that the disclosure is not limited to the various forms described and illustrated as examples. A large variety of modifications have been described and more are part of the knowledge of the person skilled in the art. These and further modifications as well as any replacement by technical equivalents may be added to the description and figures, without leaving the scope of the protection of the disclosure and of the present patent.

The invention claimed is:

1. A heat transfer system comprising:
   a structural member comprising:
      an upper skin;
      a lower skin; and
      a foam core disposed between the upper skin and the lower skin;
   at least one heat conducting array extending through the foam core and between the upper skin and the lower skin, the heat conducting array defining at least one upper cap, at least one lower cap, and a wall portion extending between the at least one upper cap and the at least one lower cap, the at least one upper cap being disposed proximate a heat source, the heat conducting array being a pyrolytic graphite sheet (PGS) material; and
   a heat conducting spreader disposed between the at least one lower cap of the heat conducting array and the lower skin of the structural member, the heat conducting array being pyrolytic graphite sheet (PGS) material,
   wherein the heat conducting array dissipates heat from the heat source by transferring heat from the at least one upper cap, through the wall portion, to the at least one lower cap, to the heat conducting spreader, through the lower skin, and out to an atmosphere.

2. The heat transfer system according to claim 1, wherein the at least one upper cap comprises a plurality of upper caps and the at least one lower cap comprises a plurality of lower caps.

3. The heat transfer system according to claim 1, wherein the upper skin and the lower skin define a para-aramid synthetic fiber material.

4. The heat transfer system according to claim 1, wherein the foam core is a polystyrene foam material.

5. The heat transfer system according to claim 1, wherein the wall portion of the heat conducting array extends vertically between the at least one upper cap and the at least one lower cap.

6. The heat transfer system according to claim 1, wherein the wall portion of the heat conducting array extends at an angle between the at least one upper cap and the at least one lower cap.

7. The heat transfer system according to claim 1, wherein the wall portion of the heat conducting array defines a plurality of apertures.

8. The heat transfer system according to claim 1, wherein the heat conducting array is a continuous piece.

9. The heat transfer system according to claim 1, wherein the structural member is an aircraft skin.

10. The heat transfer system according to claim 1, wherein the at least one upper cap of the heat conducting array is disposed proximate a heat generating component within an avionics bay of an aircraft.

11. The heat transfer system according to claim 1, wherein the heat source is avionics or batteries disposed within an equipment bay, and the heat transfer system is disposed between the avionics or batteries and an inner wall portion of the equipment bay.

12. A heat transfer system comprising:
a structural member comprising:
an upper skin;
a lower skin; and
a foam core disposed between the upper skin and the lower skin;
a heat conducting array extending through the foam core and between the upper skin and the lower skin, the heat conducting array defining a plurality of upper caps, a plurality of lower caps, and wall portions extending between the upper caps and the lower caps, the upper caps being disposed proximate heat sources; and
a heat conducting spreader disposed between the lower caps of the heat conducting array and the lower skin of the structural member,
wherein the heat conducting array and the heat conducting spreader are a pyrolytic graphite sheet (PGS) material,
wherein the heat conducting array dissipates heat from the heat source by transferring heat from the upper caps, through the wall portion, to the lower caps, to the heat conducting spreader, through the lower skin, and out to an atmosphere.

13. The heat transfer system according to claim 12, wherein the wall portion of the heat conducting array extends vertically between the upper cap and the lower cap.

14. The heat transfer system according to claim 12, wherein the wall portion of the heat conducting array extends at an angle between the upper cap and the lower cap.

15. The heat transfer system according to claim 12, wherein the structural member is an aircraft skin.

16. The heat transfer system according to claim 12, wherein the heat sources are heat generating components within an avionics bay of an aircraft.

17. A heat transfer system comprising:
at least one heat conducting array extending through a structure, the heat conducting array defining at least one upper cap, at least one lower cap, and a wall portion extending between the at least one upper cap and the at least one lower cap, the at least one upper cap being disposed proximate a heat source, the heat conducting array being a pyrolytic graphite sheet (PGS) material; and
a heat conducting spreader disposed along the at least one lower cap of the heat conducting array, the heat conducting spreader being a pyrolytic graphite sheet (PGS) material,
wherein the heat conducting array dissipates heat from the heat source by transferring heat from the upper cap, through the wall portion, to the lower cap, and to the heat conducting spreader.

18. The heat transfer system according to claim 17, wherein the at least one upper cap comprises a plurality of upper caps and the at least one lower cap comprises a plurality of lower caps.

19. The heat transfer system according to claim 17, wherein the wall portion of the heat conducting array extends vertically between the at least one upper cap and the at least one lower cap.

20. The heat transfer system according to claim 17, wherein the wall portion of the heat conducting array extends at an angle between the at least one upper cap and the at least one lower cap.

21. The heat transfer system according to claim 17, wherein the heat sources are avionics or batteries disposed within an equipment bay, and the heat transfer system is disposed between the avionics or batteries and an inner wall portion of the equipment bay.

22. A heat transfer system comprising:
a structural member comprising:
an upper skin;
a lower skin; and
a core disposed between the upper skin and the lower skin; and
a heat conducting array extending through the core and between the upper skin and the lower skin, the heat conducting array defining at least one upper cap, at least one lower cap, and at least one wall portion extending between the at least one upper cap and the at least one lower cap, the upper cap being disposed proximate heat sources, the heat conducting array being a pyrolytic graphite sheet (PGS) material,
wherein the heat conducting array dissipates heat from the heat sources by transferring heat from the at least one upper cap, through the wall portion, to the at least one lower cap, through the lower skin, and out to an atmosphere.

23. The heat transfer system according to claim 22, wherein the heat sources are avionics or batteries disposed within an equipment bay, and the heat transfer system is disposed between the avionics or batteries and an inner wall portion of the equipment bay.

* * * * *